(12) United States Patent
Hourné

(10) Patent No.: US 12,007,522 B2
(45) Date of Patent: Jun. 11, 2024

(54) PRESENCE DETECTION SENSOR FOR A MOTOR VEHICLE

(71) Applicant: VITESCO TECHNOLOGIES GMBH, Hanover (DE)

(72) Inventor: Xavier Hourné, Toulouse (FR)

(73) Assignee: VITESCO TECHNOLOGIES GMBH, Hanover (DE)

(*) Notice: Subject to any disclaimer, the term of this patent is extended or adjusted under 35 U.S.C. 154(b) by 445 days.

(21) Appl. No.: 17/289,284

(22) PCT Filed: Oct. 25, 2019

(86) PCT No.: PCT/EP2019/079220
§ 371 (c)(1),
(2) Date: Apr. 28, 2021

(87) PCT Pub. No.: WO2020/089094
PCT Pub. Date: May 7, 2020

(65) Prior Publication Data
US 2021/0247540 A1   Aug. 12, 2021

(30) Foreign Application Priority Data

Oct. 30, 2018  (FR) .................................. 1860034

(51) Int. Cl.
*G01V 3/10* (2006.01)
*E05B 81/76* (2014.01)
(Continued)

(52) U.S. Cl.
CPC .............. *G01V 3/101* (2013.01); *E05B 81/76* (2013.01); *H04B 5/70* (2024.01); *H05K 1/0243* (2013.01);
(Continued)

(58) Field of Classification Search
CPC ....................................................... G01V 3/00
(Continued)

(56) References Cited

U.S. PATENT DOCUMENTS 5,172,061 A * 12/1992 Crooks .............. G01R 33/3628
324/318
7,132,996 B2   11/2006 Evans et al.
(Continued)

FOREIGN PATENT DOCUMENTS

CN         1602563 A     3/2005
CN       101009150 A     8/2007
(Continued)

OTHER PUBLICATIONS

International Search Report for PCT/EP2019/079220 dated Jan. 27, 2020, 5 pages.
(Continued)

*Primary Examiner* — Vincent Q Nguyen
(74) *Attorney, Agent, or Firm* — NIXON & VANDERHYE

(57) ABSTRACT

Disclosed is a detection sensor for detecting the presence of an item of user equipment through near-field communication for a motor vehicle, the sensor including an antenna, an impedance matcher, a driver module for driving the antenna and a microcontroller, which is configured to control the driver module, the impedance matcher being able to match the output impedance of the driver module to the impedance of the antenna while amplifying the power supplied by the driver module. The sensor includes a resistive module, mounted between the driver module and the impedance matcher, configured to stabilize the value of the input power of the impedance matcher.

20 Claims, 1 Drawing Sheet

(51) Int. Cl.
*H04B 5/70* (2024.01)
*H05K 1/02* (2006.01)

(52) U.S. Cl.
CPC .............. *H05K 2201/10098* (2013.01); *H05K 2201/10151* (2013.01)

(58) Field of Classification Search
USPC ....................................................... 324/650
See application file for complete search history.

(56) References Cited

U.S. PATENT DOCUMENTS

| | | | |
|---|---|---|---|
| 7,834,813 | B2 | 11/2010 | Caimi et al. |
| 8,849,520 | B2 | 9/2014 | Hammerschmidt |
| 8,958,761 | B2 | 2/2015 | Visser |
| 9,520,841 | B2 | 12/2016 | Langer |
| 9,876,476 | B2 | 1/2018 | Coumou et al. |
| 10,666,206 | B2 | 5/2020 | Coumou et al. |
| 2004/0246157 | A1 | 12/2004 | Trocque |
| 2007/0170910 | A1 | 7/2007 | Chang et al. |
| 2008/0061800 | A1 | 3/2008 | Reynolds et al. |
| 2008/0186245 | A1* | 8/2008 | Hilgers ............ G06K 19/07749 343/803 |
| 2012/0235504 | A1* | 9/2012 | Kesler ................... H02J 50/70 307/104 |
| 2014/0319923 | A1 | 10/2014 | Lee et al. |
| 2017/0235386 | A1 | 8/2017 | Almholt |
| 2021/0268850 | A1* | 9/2021 | Kessler ............... B60C 23/0452 |

FOREIGN PATENT DOCUMENTS

| | | |
|---|---|---|
| CN | 101496222 A | 7/2009 |
| CN | 101636915 A | 1/2010 |
| CN | 102904532 A | 1/2013 |
| CN | 103326685 A | 9/2013 |
| CN | 103365204 A | 10/2013 |
| CN | 106528373 | 3/2017 |
| CN | 107924804 A | 4/2018 |
| FR | 3 038 642 | 1/2017 |
| WO | 03/021789 | 3/2003 |
| WO | 2016034893 A1 | 3/2016 |

OTHER PUBLICATIONS

Written Opinion of the ISA for PCT/EP2019/079220 dated Jan. 27, 2020, 7 pages.
Office Action, issued in Chinese Patent Application No. 201980071767.4 dated Nov. 1, 2023.

* cited by examiner

PRESENCE DETECTION SENSOR FOR A MOTOR VEHICLE

CROSS-REFERENCE TO RELATED APPLICATIONS

This application is the U.S. national phase of International Application No. PCT/EP2019/079220 filed Oct. 25, 2019 which designated the U.S. and claims priority to FR 1860034 filed Oct. 30, 2018, the entire contents of each of which are hereby incorporated by reference.

BACKGROUND OF THE INVENTION

Field of the Invention

The invention relates to detection sensors and more particularly to a detection sensor for a motor vehicle. The invention aims in particular to improve the impedance matchers used in detection sensors for a motor vehicle.

Description of the Related Art

In a motor vehicle, it is known practice to use sensors to detect the presence of a user near the vehicle in order, for example, to unlock its opening elements. Thus, for example, it is known practice to mount detection sensors in the handles of the doors or near the trunk.

In one existing solution, the sensor is configured to communicate with an item of user equipment, in particular a smartphone or a fob, via a standardized communication protocol known by the name NFC (near-field communication).

Such a sensor comprises an antenna and a microcontroller which controls, via an impedance matcher, a driver module for driving the antenna, also known to a person skilled in the art by the name "driver". In a known manner, the microcontroller, the driver module and the impedance matcher are mounted on a printed circuit board while the antenna is in the form of a flexible element fixed to an edge of said board and curved so as to extend over the board, in particular in order to increase the efficiency of the antenna while optimizing the internal space of the housing in which the sensor is mounted. Furthermore, the voltage defined across the terminals of the antenna is decreased by a capacitive bridge in order to be able to be digitized, via an analog-to-digital converter, and utilized by the microcontroller, in particular for the purpose of detecting variations in the voltage across the terminals of the antenna which might be associated with the presence of a fob or of a smartphone near the sensor.

The impedance matcher allows the output impedance of the driver module to be matched to the impedance of the antenna while amplifying the power of the driver module. In practice, since the output voltage of the driver module is fixed and the intensity value of the current consumed is predetermined, the matching impedance that the impedance matcher must have is deduced therefrom, this impedance value being fixed by the type, the number and the value of the components of the circuit of the impedance matcher. For example, if the output voltage of the driver module is 5 V and a current of an intensity of 100 mA must be consumed, the impedance matcher must be sized to have an impedance of Z=U/I=50 ohms. In other words, the type, the number and the value of the components of the circuit of the impedance matcher must be chosen so that the impedance of the impedance matcher is 50 ohms at the operating frequency, which is 13.56 MHz in the NFC standard.

However, numerous factors can make the value of the matching impedance vary from one sensor to another when the sensor is mounted in the vehicle, in particular in a door handle. In particular, the mechanical tolerances for the positioning of the board of the sensor as well as of the antenna with respect to the board generate a stray capacitance between the antenna and the sensor which modifies the value of the matching impedance. Likewise, the specific characteristics of the antenna or else imprecise values or unpredictable behavior of the components of the impedance matcher can make the value of the matching impedance of the impedance matcher vary.

Such variations in the value of the matching impedance have the effect of making the voltage defined across the terminals of the antenna vary. Now, these variations can lead to the maximum conversion value of the analog-to-digital converter being exceeded, the saturation of which then no longer allows the value of the voltage across the terminals of the antenna to be determined and therefore the presence of a fob or of a smartphone near the sensor to be detected.

SUMMARY OF THE INVENTION

The invention therefore aims to at least partly overcome these drawbacks by proposing a simple and efficient detection sensor solution.

To this end, a first subject of the invention is a detection sensor for detecting the presence of an item of user equipment through near-field communication, said sensor being intended to be mounted in a motor vehicle and comprising an antenna, an impedance matcher, a driver module for driving the antenna and a microcontroller, which is configured to control the driver module, said impedance matcher being able to match the output impedance of the driver module to the impedance of the antenna while amplifying the voltage and the current supplied by said driver module, through a resonance effect, said sensor being noteworthy in that it comprises a resistive module, mounted between the driver module and the impedance matcher, configured to stabilize the value of the input power of the impedance matcher.

The stabilization of the input power of the impedance matcher by the resistive module allows the power of the antenna, and therefore the variations in the voltage defined across the terminals of the antenna, to be stabilized. By doing this, the measurements of the voltage defined across the terminals of the antenna, which are used by the microcontroller, do not leave a predefined range, making it possible in particular to avoid the saturation of an analog-to-digital converter, implemented in the driver module to convert this voltage into a numerical value which can be utilized by the microcontroller.

Preferably, the resistive module comprises at least one resistor, for example two resistors connected on an input branch of the impedance matcher where appropriate.

Advantageously, the resistive module has a resistance value between plus or minus 20, 40 or 80% of the value of the real part of the matching impedance of the impedance matcher, such values allowing the input power of the impedance matcher to be stabilized according to the configuration of the circuit (type, number and values of the components of the circuit constituting the impedance matcher).

In one embodiment, the resistive module has a resistance value of the order of the value of the real part of the matching impedance of the impedance matcher, such a value allowing the derivative of the input power of the impedance matcher, with respect to the impedance value of said impedance matcher, to be made to tend toward zero, or even to be nullified, in order to stabilize the input power of the impedance matcher.

It should be noted that, the lower the resistance value of the resistive module, the less energy is consumed by said resistive module, which makes the sensor overall less energy-consuming. The aim is thus to find, according to the configuration of the sensor and to the impedance matcher (type, number and values of the components of the circuit constituting the impedance matcher), the best compromise between the resistance value of the resistive module allowing the stabilization of the input power of the impedance matcher and the losses through dissipation in said resistive module.

For example, the resistive module can have a resistance value between 1 and 100 ohms, for example of the order of 20 ohms when the target impedance for which the impedance matcher is designed is 50 ohms.

According to one aspect of the invention, the microcontroller, the driver module and the impedance matcher are mounted on a printed circuit board while the antenna is in the form of a flexible element fixed to an edge of said board and curved so as to extend over the board. This allows the efficiency of the antenna to be increased while optimizing the internal space of the housing in which the sensor is mounted.

According to one feature of the invention, the sensor, in particular the driver module, comprises at least one capacitive bridge, allowing the voltage defined across the terminals of the antenna to be decreased, and an analog-to-digital converter able to convert the voltage value decreased by said capacitive bridge into a numerical value which can be used by the microcontroller, in particular for the purpose of detecting variations in the voltage across the terminals of the antenna which might be associated with the presence of a fob or of a smartphone near the sensor.

The invention also relates to a motor vehicle comprising at least one sensor such as presented above.

The invention relates finally to a method for stabilizing the power supplied by a driver module to an impedance matcher of a detection sensor, preferably such as described above, for a motor vehicle, wherein the power is stabilized by a resistive module connected between the driver module and the impedance matcher.

BRIEF DESCRIPTION OF THE DRAWINGS

Other features and advantages of the invention will become apparent from the following description, which is given with reference to the appended figures, which are given by way of non-limiting examples and in which identical references are given to similar objects.

DESCRIPTION OF THE PREFERRED EMBODIMENTS

The sensor according to the invention is intended to be mounted in a vehicle, in particular a motor vehicle, to detect the presence of an item of user equipment through near-field communication (or NFC) in order to activate a function of the vehicle such as, for example, the opening of an opening element of the vehicle. The item of user equipment may in particular be a fob or a smartphone able to communicate with the sensor over an NFC communication link. Preferably, but non-limitingly, the detection sensor according to the invention is intended to be mounted in a door handle of a motor vehicle.

Figure 1:
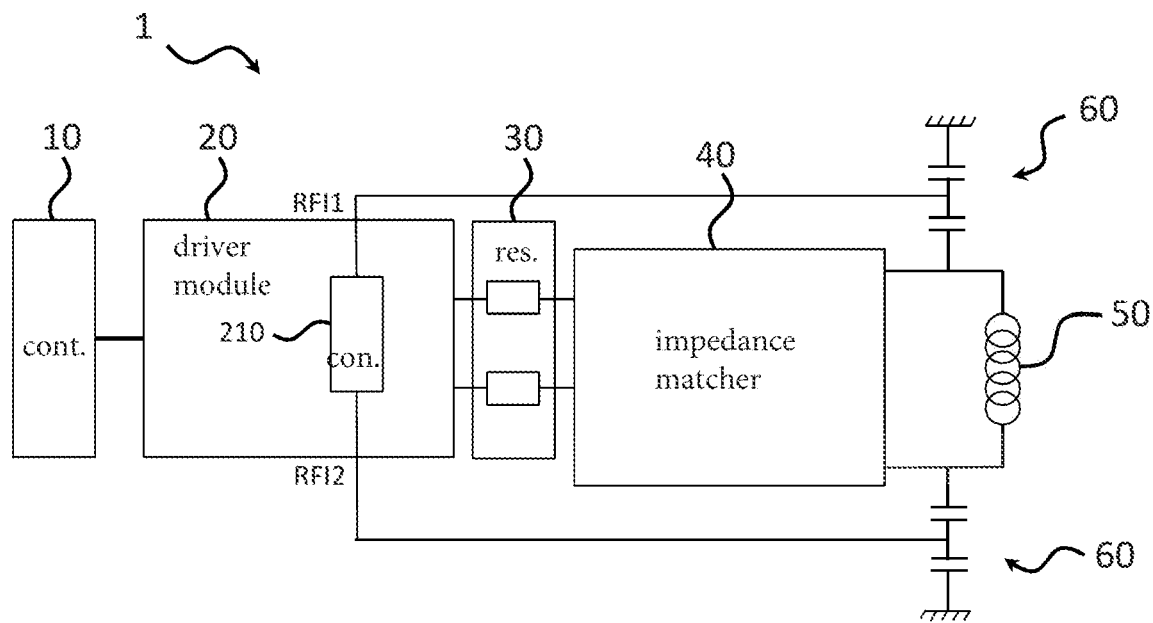
FIG. 1 describes one embodiment of a detection sensor according to the invention.

FIG. 1 shows an example of a sensor 1 according to the invention. The sensor 1 comprises a microcontroller 10, a driver module 20, a resistive module 30, an impedance matcher 40 and an antenna 50.

The microcontroller 10 is configured to control the driver module 20, in particular by configuring its registers with the aid of a digital link, in a manner known per se. The driver module 20 is configured in particular to encode the physical layer of the NFC communication.

The impedance matcher 40 is configured to match the output impedance of the driver module 20 to the impedance of the antenna 50 while amplifying the voltage and the current supplied by said driver module 20 through a resonance effect.

The antenna 50 is for example in the form of an inductive coil and is connected by both its terminals to the impedance matcher 40. The antenna 50 allows a magnetic field to be generated, the intensity of which is proportional to the power supplied by the impedance matcher 40, which will serve to excite the antenna of a fob or of a smartphone located nearby.

Both terminals of the antenna 50 are also each connected to an analog input of the microcontroller 10 via a voltage-dividing capacitive bridge 60. This capacitive bridge 60 allows the voltage potential seen at the terminal of the antenna 50 to which it is connected to be reduced in order to transform the voltage defined across the terminals of the antenna 50, which is for example of the order of 50 V, into a voltage the value of which, which is lower, comes within the operating range of the microcontroller 10, for example between 0 and 5 V. The driver module 20 comprises an analog-to-digital converter 210 which is configured to transform this reduced voltage, designated "image voltage" in the present document, which is defined between the two analog input terminals RFI1, RFI2 of the driver module 20, into a numerical value representative of said voltage and between 0 and ($2^n-1$), where n is a natural number representing the number of digital bits over which the voltage values are coded.

Thus, for example, in the case of an 8-bit converter, used as standard in detection sensors for a motor vehicle given its low cost and its simplicity, the value of the image voltage, which is analog, is transformed into a numerical value between "0" and "255".

Such a converter 210 is configured to operate in an analog operating range so that any instance of the voltage value received at the input of the converter 210 exceeding the upper limit of the operating range is attributed the maximum numerical value, for example "255" in the preceding example, or a little less according to the type of converter 210 (for example "230" for a converter 210 operating over eight bits) because of a limitation caused by certain components.

In this case, the converter 210 is said to be saturated and it is then no longer possible to distinguish the values of the image voltage which are higher than the upper limit of the operating range of the converter 210 from each other. The voltage defined across the terminals of the antenna 50 must therefore vary little, along with the image voltage, the value of which must therefore remain within the operating range of the driver module 20 for the numerical values, which are utilized by the microcontroller 10, to be pertinent.

To do this, and avoid such saturation of the converter 210, the sensor 1 comprises a resistive module 30 connected between the driver module 20 and the impedance matcher 40.

This resistive module 30 has a resistance value, in ohms, which allows the value of the input power of the impedance adapter 40, supplied by the driver module 20 via said resistive module 30, to be stabilized.

In this preferred example, the resistive module 30 comprises a resistor on each input terminal of the impedance matcher 40. As a variant, the resistive module 30 could comprise one or more than two resistors.

Figure 2:
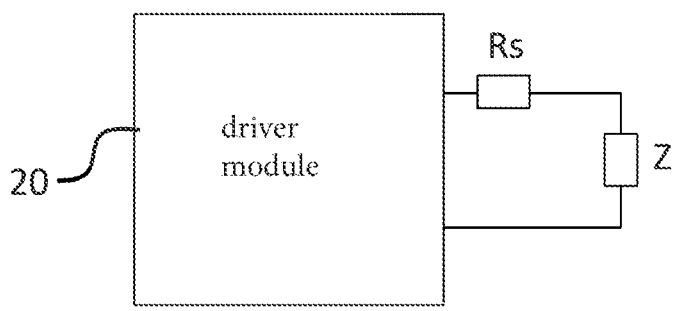
FIG. 2 illustrates an equivalent circuit diagram of the driver module, of the resistive module and of the impedance matcher of the sensor of FIG. 1.

FIG. 2 shows an example of an equivalent electrical circuit representing the driver module 20 connected to the resistive module 30, represented by the equivalent resistor Rs, and to the impedance matcher 40, represented by the impedance Z.

The power at the input of the impedance matcher 40, denoted P_matching, is then given by the following formula:

$$P\_matching = \frac{Z * Vd^2}{(Rs + Z)^2}$$

where Vd is the amplitude of the voltage signal oscillating at the operating frequency, of 13.56 MHz in NFC, supplied by the driver module 20.

In order to stabilize the input power P_matching of the impedance matcher 40, it is necessary to make its derivative tend toward zero when the impedance Z varies:

$$\frac{dPmatching}{dz} \to 0.$$

Making the assumption that the derivative is zero, then:

$$\frac{dPmatching}{dz} = 0$$

Thus, by differentiating $$\frac{Z * Vd^2}{(Rs + Z)^2}$$

with respect to Z, what is obtained is:

$$\frac{dPmatching}{dz} = \frac{Rs^2 - Z^2}{(Rs + Z)^4} * Vd^2$$

It is then observed that $$\frac{dPmatching}{a_Z} = 0$$

when Rs=Z, Z being the target impedance corresponding to the value of the output voltage of the driver module 20 divided by the intensity value supplied by the driver module 20.

Table 1 shows an example of a test varying the value of the impedance of the impedance matcher 40 for a real target impedance value equal to 50 ohms and an Rs value equal to the value of the target impedance:

TABLE 1

| Z | 50 | 45 | 40 | 35 | 30 | 25 | 20 | 15 | 10 |
|---|---|---|---|---|---|---|---|---|---|
| N (Rs = 0 Ω) | 190 | 200 | 212 | 227 | 245 | 255 | 255 | 255 | 255 |
| N (Rs = 50 Ω) | 190 | 189 | 189 | 187 | 184 | 179 | 172 | 160 | 142 |

In this example, it is observed that the numerical value of the image voltage given by the converter 210 is identical in the presence or in the absence of the resistive module 30 (Rs=0 or Rs=50 ohms) when the impedance value is equal to the target impedance of 50 ohms. When the impedance value of the impedance matcher 40 is varied, it is observed that the converter 210 is saturated when Z is lower than or equal to 25 ohms in the absence of the resistive module 30 but that it is not saturated in the presence of the resistive module 30. In this example, it is observed, by contrast, that the numerical value of the image voltage given by the converter 210 decreases with the value of the impedance in the presence of a resistive module 30 the resistance value of which is equal to the target impedance. This results in a drop in sensitivity but the converter 210 is not saturated.

Table 2 shows an example of a test varying the value of the impedance of the impedance matcher 40 for a real target impedance value equal to 50 ohms and an Rs value equal to 20 ohms:

TABLE 2

| Z (Im(Z) = 0) | 50 | 45 | 40 | 35 | 30 | 25 | 20 | 15 | 10 |
|---|---|---|---|---|---|---|---|---|---|
| N ( Rs = 0 Ω) | 190 | 200 | 212 | 227 | 245 | 255 | 255 | 255 | 255 |
| N ( Rs = 20 Ω) | 190 | 194 | 198 | 202 | 206 | 209 | 210 | 207 | 198 |

In this example, it is observed that the numerical value of the image voltage given by the converter 210 is identical in the presence or in the absence of the resistive module 30 (Rs=0 or Rs=50 ohms) when the impedance value is equal to the target impedance of 50 ohms. When the impedance value of the impedance matcher 40 is varied, it is observed that the converter 210 is saturated when Z is less than or equal to 25 ohms in the absence of the resistive module 30 but that it is not saturated in the presence of the resistive module 30. It is observed that the numerical value of the image voltage given by the converter 210 varies and increases slightly up to "210" when the value of the impedance decreases in the presence of a resistive module 30 the resistance value of which is lower than the target impedance value.

The presence of a resistive module 30 allows the input power P_matching of the impedance matcher 40, and therefore the power delivered to the antenna 50, to be stabilized, which reduces the amplitude of the variations in the voltage defined across the terminals of the antenna 50 and therefore in the image voltage, allowing the converter 210 to operate within its operating range without being saturated and with significant stability.

The invention claimed is:

1. A detection sensor to detect a presence of an item of user equipment through near-field communication, said detection sensor being configured to be mounted in a motor vehicle, the detection sensor comprising:
   an antenna;
   a driver module configured to drive the antenna;

an impedance matcher configured to match the output impedance of the driver module to the impedance of the antenna and configured to amplify the voltage and the current supplied by the driver module;

a resistive module mounted between the driver module and the impedance matcher, the resistive module comprising at least one resistor configured to stabilize the value of the input power of the impedance matcher; and a microcontroller configured to control the driver module.

2. The sensor as claimed in claim 1, wherein the resistive module has a resistance value between plus or minus 80% of the value of the real part of the matching impedance of the impedance matcher.

3. The sensor as claimed in claim 2, wherein the resistive module has a resistance value between 1 and 100 ohms.

4. The sensor as claimed in claim 2, wherein the microcontroller, the driver module, and the impedance matcher are mounted on a printed circuit board.

5. A motor vehicle comprising at least one sensor as claimed in claim 2.

6. A method for stabilizing power supplied by the driver module to the impedance matcher of the detection sensor as claimed in claim 1 for a motor vehicle, the method comprising:

stabilizing the power by the resistive module of the detection sensor, the resistive module connected between the driver module and the impedance matcher.

7. The sensor as claimed in claim 1, wherein the resistive module has a resistance value between the value of the real part minus 40% and the value of the real part plus 40% of the matching impedance of the impedance matcher.

8. The sensor as claimed in claim 7, wherein the resistive module has a resistance value between 1 and 100 ohms.

9. The sensor as claimed in claim 7, wherein the microcontroller, the driver module, and the impedance matcher are mounted on a printed circuit board.

10. A motor vehicle comprising at least one sensor as claimed in claim 7.

11. The sensor as claimed in claim 1, wherein the resistive module has a resistance value between the value of the real part minus 20% and the value of the real part plus 20% of the matching impedance of the impedance matcher.

12. The sensor as claimed in claim 11, wherein the resistive module has a resistance value between 1 and 100 ohms.

13. The sensor as claimed in claim 11, wherein the microcontroller, the driver module, and the impedance matcher are mounted on a printed circuit board.

14. The sensor as claimed in claim 1, wherein the resistive module has a resistance value equal to the value of the real part of the matching impedance of the impedance matcher.

15. The sensor as claimed in claim 14, wherein the resistive module has a resistance value between 1 and 100 ohms.

16. The sensor as claimed in claim 14, wherein the microcontroller, the driver module, and the impedance matcher are mounted on a printed circuit board.

17. The sensor as claimed in claim 1, wherein the resistive module has a resistance value between 1 and 100 ohms.

18. The sensor as claimed in claim 17, wherein the microcontroller, the driver module, and the impedance matcher are mounted on a printed circuit board.

19. The sensor as claimed in claim 1, wherein the microcontroller, the driver module, and the impedance matcher are mounted on a printed circuit board.

20. A motor vehicle comprising at least one sensor as claimed in claim 1.

* * * * *